US011152055B1

(12) United States Patent
Lee

(10) Patent No.: US 11,152,055 B1
(45) Date of Patent: Oct. 19, 2021

(54) APPARATUSES INCLUDING THRESHOLD VOLTAGE COMPENSATED SENSE AMPLIFIERS AND METHODS FOR COMPENSATING SAME

(71) Applicant: Micron Technology, Inc., Boise, ID (US)

(72) Inventor: Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/934,909

(22) Filed: Jul. 21, 2020

(51) Int. Cl.
*G11C 7/06* (2006.01)
*G11C 11/4091* (2006.01)
*G11C 7/08* (2006.01)
*G11C 11/4094* (2006.01)
*G11C 7/12* (2006.01)

(52) U.S. Cl.
CPC ...... *G11C 11/4091* (2013.01); *G11C 11/4094* (2013.01); *G11C 7/065* (2013.01); *G11C 7/12* (2013.01); *G11C 2207/005* (2013.01)

(58) Field of Classification Search
CPC ............ G11C 11/4091; G11C 11/4094; G11C 2207/005; G11C 7/065; G11C 7/12
USPC ......................................... 365/207, 203, 205
See application file for complete search history.

(56) References Cited

U.S. PATENT DOCUMENTS

| | | | | |
|---|---|---|---|---|
| 5,469,393 A | * | 11/1995 | Thomann | G11C 29/04 365/190 |
| 9,431,094 B1 | * | 8/2016 | Takai | G11C 7/1093 |
| 2002/0101771 A1 | * | 8/2002 | Lee | G11C 29/789 365/200 |
| 2002/0118576 A1 | * | 8/2002 | Ohba | G11C 16/28 365/189.07 |

* cited by examiner

*Primary Examiner* — Ly D Pham
(74) *Attorney, Agent, or Firm* — Dorsey & Whitney LLP

(57) ABSTRACT

Apparatuses including threshold voltage compensated sense amplifiers and methods for compensating same are disclosed. An example threshold voltage compensated sense amplifier according to the disclosure includes circuits, such as isolation transistors and at least one precharge transistor, that are used to provide threshold voltage compensation.

21 Claims, 7 Drawing Sheets

APPARATUSES INCLUDING THRESHOLD VOLTAGE COMPENSATED SENSE AMPLIFIERS AND METHODS FOR COMPENSATING SAME

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be sensed and amplified by a sense amplifier to indicate the value of the data state stored in the memory cell.

Conventional sense amplifiers are typically coupled to a pair of complementary digit lines to which a large number of memory cells (not shown) are coupled. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and serves as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged during a precharge period to a precharge voltage, such as one-half of a supply voltage, so that a voltage difference can be accurately sensed and amplified during a subsequent sensing operation. However, due to random threshold voltage mismatch of transistor components, the digit lines may be abruptly imbalanced before a voltage change is sensed and amplified on one of the digit lines. Such threshold voltage deviations can cause the sense amplifier to erroneously amplify input signals in the wrong direction.

To address the above threshold voltage deviations, sense amplifier designs that alleviate threshold voltage mismatches have been developed. However, these sense amplifier designs including such voltage compensation have increased an area size of a sense amplifier region. Therefore, there is a need for an area reduction of the sense amplifier region.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
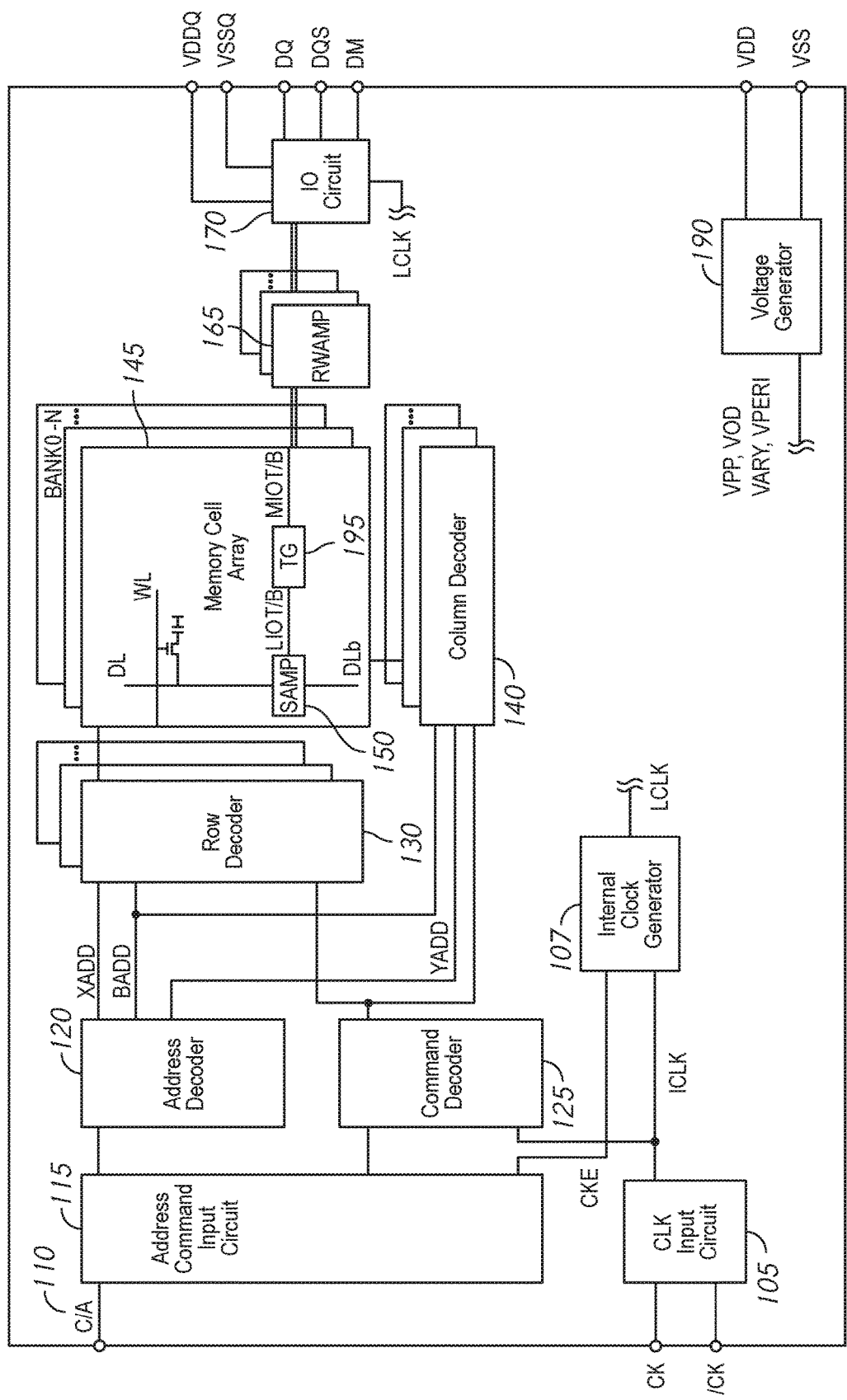
FIG. 1 is a schematic block diagram of a semiconductor device according to an embodiment of the disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL, and a plurality of memory cells MC arranged at intersections of the plurality of word lines WL and the plurality of digit lines DL. The selection of the word line WL for each bank BANK0-N is performed by a corresponding row decoder 130 and the selection of the digit line DL is performed by a corresponding column decoder 140. The plurality of sense amplifiers 150 are located for their corresponding digit lines DL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof, in some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195).

In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variances in the performance between circuit components of the sense amplifiers 150 (e.g., due to process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing digit lines DL and DLb coupled to the sense amplifiers 150 using internal nodes of the sense amplifier 150 that are configured to provide sensed data to an output node. The bias of the digit lines DL and DLb may be based on threshold differences between at least two circuit components (e.g., transistors) of the sense amplifier 150. While compensating for threshold voltage Vt differences between circuit components within the sense amplifier 150 may improve reliability.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal)(ADD to the row decoder 130, and a column address signal YARD to the column decoder 140. The address decoder 120 may also receive the hank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when activate and read commands are issued and a row address and a column address are timely supplied with the activate and read commands, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when activate and write commands are issued and a row address and a column address are timely supplied with the activated and write commands, and the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107, The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VBLP, NSA_BIAS, VARY, VPERI, and the like based on the power supply voltages VDD and VSS. The internal voltage VPP is mainly used in the row decoder 130, the internal voltages VOD, VBLP, NSA_BIAS, and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
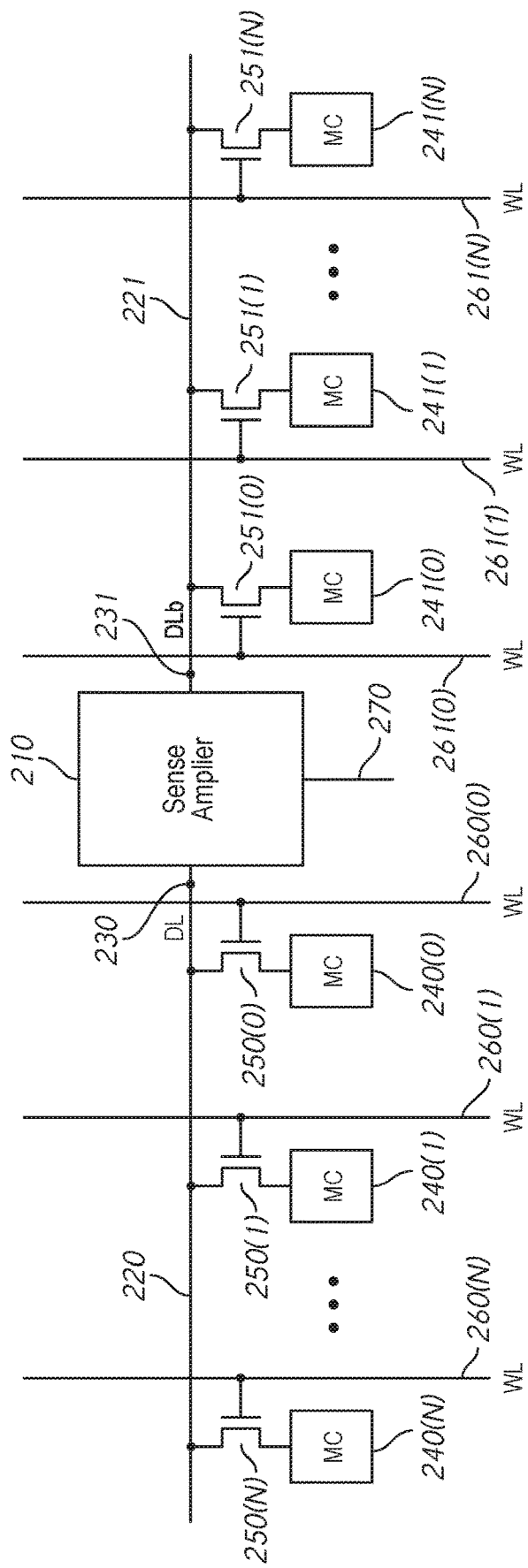
FIG. 2 is a schematic diagram of a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221 at sense nodes 230 and 231, respectively. The memory cells 240(0)-(N) may be selectively coupled through respective access devices (e.g., transistors) 250(0)-(N) to the digit line DL 220 and memory, cells 241(0)-(N) may be selectively coupled through respective access devices (e.g., transistors) 251(0)-(N) to the digit line DLb 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by, controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory, array control circuitry (e.g., the control circuitry of the memory cell array 145 of the memory banks BANK0-N of FIG. 1), or any combination thereof.

In some examples, the memory 200 may operate in general phases or modes. A first phase (e.g., precharge phase) may be initiated in response to a precharge command. During the precharge phase, the wordlines WL 260(0)-(N) and 261(0)-(N) may be set to an inactive state, and in response, the access devices 250(0)-(N) and 251(0)-(N) may all be disabled. Further, the digit lines DL 220 and DLb 221 and internal nodes of the sense amplifier 210 that are configured to provide a sensed data state to an output node may be precharged to and held at a precharge voltage, such as a digit line precharge voltage VBLP, until transitioning to a second phase.

In some examples, sense amplifier 210 includes threshold voltage compensation circuitry that compensates for threshold voltage mismatches between components of the sense amplifier 210 during a threshold voltage compensation phase. To perform the threshold voltage compensation, the sense amplifier 210 may, during a threshold voltage compensation phase, precharge or bias sense nodes 230 and 231 of the sense amplifier 210 to which the digit lines DL 220 and DLb 221 are coupled such that a voltage difference between the sense nodes 230 and 231 is approximately equal to threshold voltage differences between at least two circuit components of the sense amplifier 210. In some examples, the threshold voltage difference may be based on threshold voltages of transistors of the sense amplifier 210, Compensating for threshold voltage Vt differences between circuit components within the sense amplifier 210 may improve reliability and accuracy.

A third phase may be a cell information sampling phase. During the sampling phase, a wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. When activated, the memory cell provides a stored data state in the form of a voltage (and/or charge) to the digit line, and to a sense node of the sense amplifier 210 to which the digit line is coupled.

A fourth phase is a sense amplifier activation phase. The sense amplifier 210 may be activated to perform a sense operation to sense a data state of the activated memory cell. That is, during a sense operation, a data state stored by the activated memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary (opposite) voltage level during the sense operation. The circuitry of the memory 200 may remain in the activation phase or may transition back to the precharge phase in response to a precharge command.

With reference to the memory cells 240(0)-(N), a memory cell of the memory cells 240(0)-(N) is coupled to the digit line DL 220 through the respective access device 250(0)-(N) in response to a respective word line 260(0)-(N) becoming active. A data state stored by the memory cell is sensed and amplified by the sense amplifier 210 to drive the digit line DL 220 to a high or low voltage level corresponding to the sensed data state. The other digit line DLb 221 is driven to the complementary voltage level (e.g., the high voltage level is complementary to the low voltage level and the low voltage level is complementary to the high voltage level) during the sense operation. Similarly, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level during the sense operation.

During the threshold voltage compensation operation, the sense nodes 230 and 231 of the sense amplifier 210 may be isolated from one another in response to the control signals 270 (e.g., from a decoder circuit). For example, during the precharge phase, the sense nodes 230 and 231 of the sense amplifier 210 may be coupled to each other, and to a precharge voltage to be precharged to the precharge voltage. While the sense nodes 230 and 231 of the sense amplifier 210 are precharged, the control signals 270 may configure the sense amplifier 210 to isolate the sense nodes 230 and 231 from each other. A voltage difference may then be developed at the sense nodes 230 and 231 to provide threshold voltage compensation.

Figure 3:
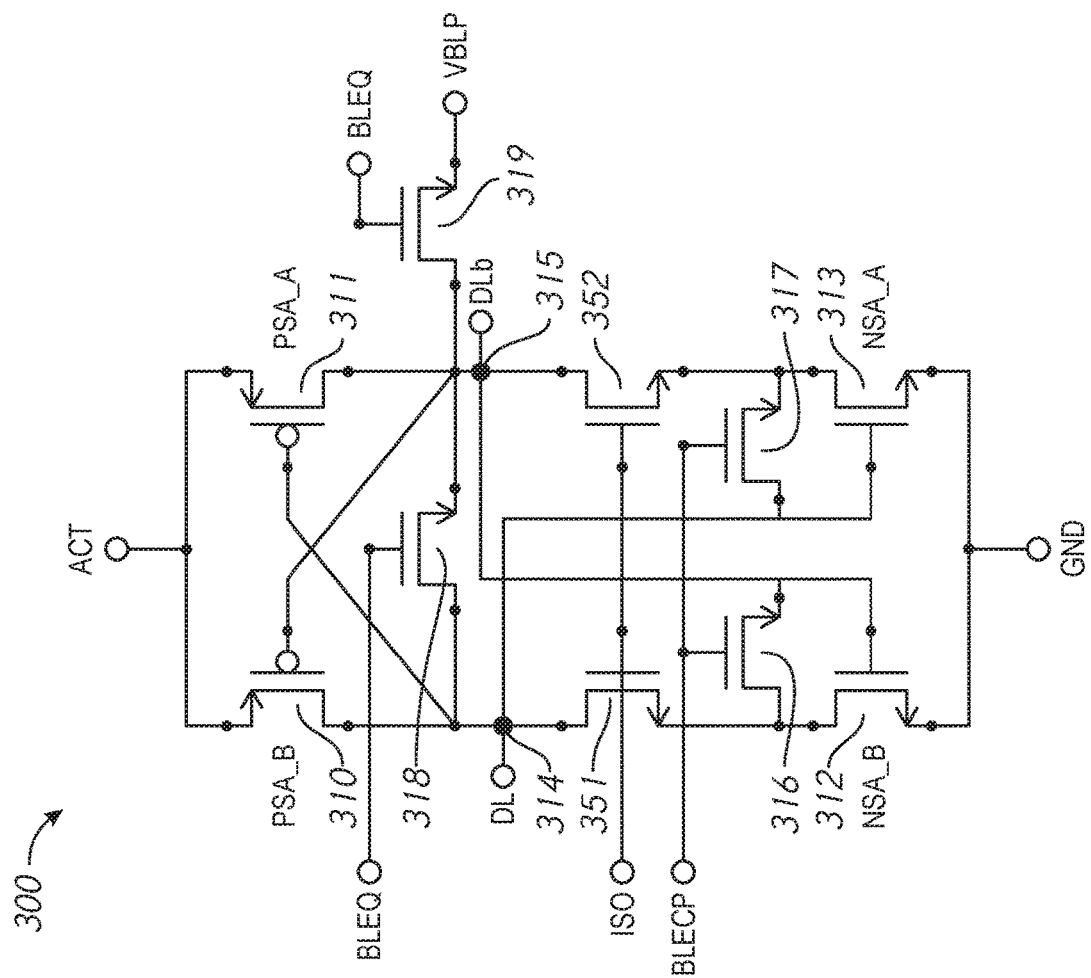
FIG. 3 is a schematic diagram of a sense amplifier according to an embodiment of the disclosure.

FIG. 3 is a schematic diagram of a sense amplifier 300 in accordance with an embodiment of the disclosure. The sense amplifier 300 may be included in one or more of the sense amplifiers 150 of FIG. 1 and/or the sense amplifier 210 of FIG. 2.

The sense amplifier 300 includes first type of transistors (e.g. p-type field effect transistors (PFET)) 310 and 311 having drains coupled to (sense) nodes 314 and 315, respectively. The sense amplifier 300 further includes second type of transistors (e.g., n-type field effect transistors (NFET)) 312 and 313 having drains coupled to the nodes 314 and 315 through isolation transistors 351 and 352, all respectively. Sources of the transistors 351 and 352 are coupled to the nodes 314 and 315 and drains of the transistors 351 and 352 are coupled to the source of the transistor 312 and the source of the transistor 313, all respectively. Respective gates of the transistors 310 and 312 are coupled to the node 315 and respective gates of the transistors 311 and 313 are coupled to the node 314. Sources of the transistors 310 and 311 are coupled to a power supply node ACT and sources of the transistors 312 and 313 are coupled to a ground node GND at a ground voltage level. A digit line DL is coupled to the node 314 and a digit line DLb is coupled to the node 315. The digit line DL may represent digit line DL 220 of FIG. 2 and the digit line DLb may represent digit line DLb 221, and the nodes 314 and 315 may represent sense nodes 230 and 231, respectively, in some embodiments of the disclosure.

The sense amplifier 300 further includes a transistor 318 having a drain and source coupled to nodes 314 and 315, respectively, and includes a precharge transistor 319 coupled to the node 315. In this embodiment, the transistor 319 is coupled to the node 315; however, in some embodiments, the transistor 319 may be coupled to the node 314 additionally or alternatively. The transistor 319 provides a voltage from its source to node 315 when activated by an active control signal BLEQ (e.g., high logic level). In some embodiments of the disclosure, the voltage VBLP is provided to the node 315 when the transistor 319 is active. Also, when activated by the active control signal BLEQ, the transistor 318 provides a conductive path between the nodes 314 and 315 to equalize the respective node voltages. In some embodiments of the disclosure, the voltage VBLP may be about 0.5V.

The sense amplifier 300 further includes transistors 316 and 317. The transistor 316 is coupled to the drain of the transistor 312 and the node 315 and the transistor 317 is coupled to the drain of the transistor 313 and the node 314. The transistors 316 and 317 are activated by an active control signal BLECP (e.g., active high logic level).

The transistors 310 and 311 are shown as PFETs and the transistors 312, 313, 316, 317, 318, 319, 351, and 352 are shown as NFETs in FIG. 3. However, one or more of the transistors may be changed to a different conductivity type, and/or to a different transistor, to a different circuit without departing from the scope of the disclosure.

As will be described below, the sense amplifier 300 may provide threshold voltage compensation. The sense amplifier 300 may provide advantageous over conventional sense amplifiers providing threshold voltage compensation. For example, the sense amplifier 300 or related circuits may include fewer circuit components e.g., transistors), such as not including a row N-sense-amp latch (IWO driver, in comparison to such other sense amplifier designs. As a result, the sense amplifier 300, as well as other sense amplifiers according to embodiments of the disclosure; may provide a more compact circuit design and have less circuit complexity.

An example operation of the sense amplifier 300 according to an embodiment of the disclosure will be described with reference to FIGS. 4A and 4B. In the example operation, it is assumed that the transistors 312 and 313 should be matched and have a same threshold voltage vth. However, typically due to variations in fabricating the transistors 312 and 313, the respective threshold voltages vth of the transistors 312 and 313 are not matched and are different. For example, assuming the transistors 312 and 313 are designed to have a nominal threshold voltage of vth, the threshold voltage mismatch between the transistors 312 and 313 may be characterized as $\varDelta$vth. That is, the threshold voltage of transistor 313 deviates from the threshold voltage of the transistor 312 by $\varDelta$vth. Similarly, due to variations in fabricating the transistors 310 and 311, the respective threshold voltages of the transistors 310 and 311 are not matched and are different. A partial threshold voltage mismatch between the transistors 310 and 311 may be characterized as $\varDelta$. Threshold voltage compensation may be provided by compensation voltage(s) provided to one or both of nodes 314 and 315 in preparation of activating the sense amplifier 300. The compensation voltage(s) provided to the nodes 314 and 315 may compensate for the threshold voltage mismatch among the transistors 312, 313, 310 and 311, which may be represented as ($\Delta$vth+$\Delta$) that is a total of the threshold voltage deviation.

Figure 4A:
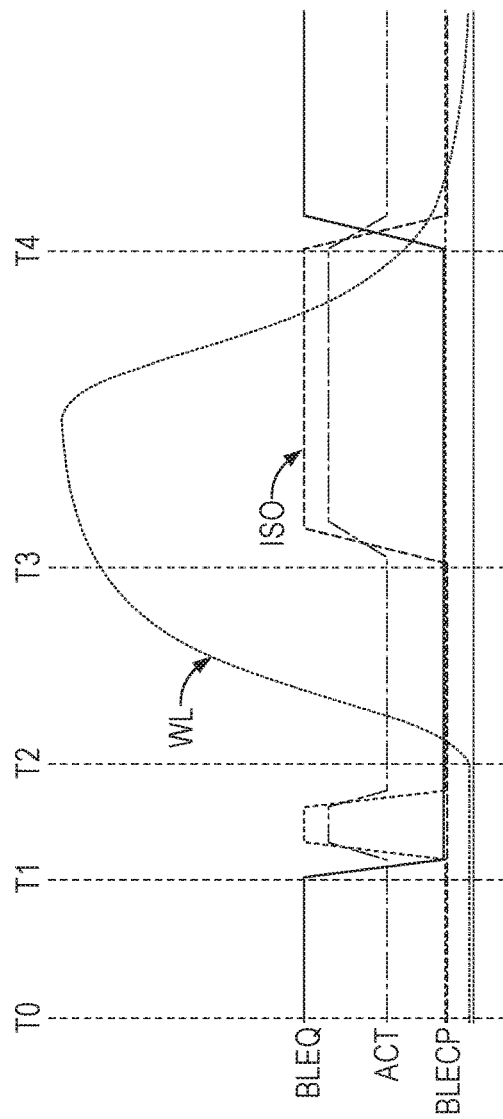
FIGS. 4A and 4B are timing diagrams of various signals during operation of the sense amplifier according to an embodiment of the disclosure.
Figure 4B:
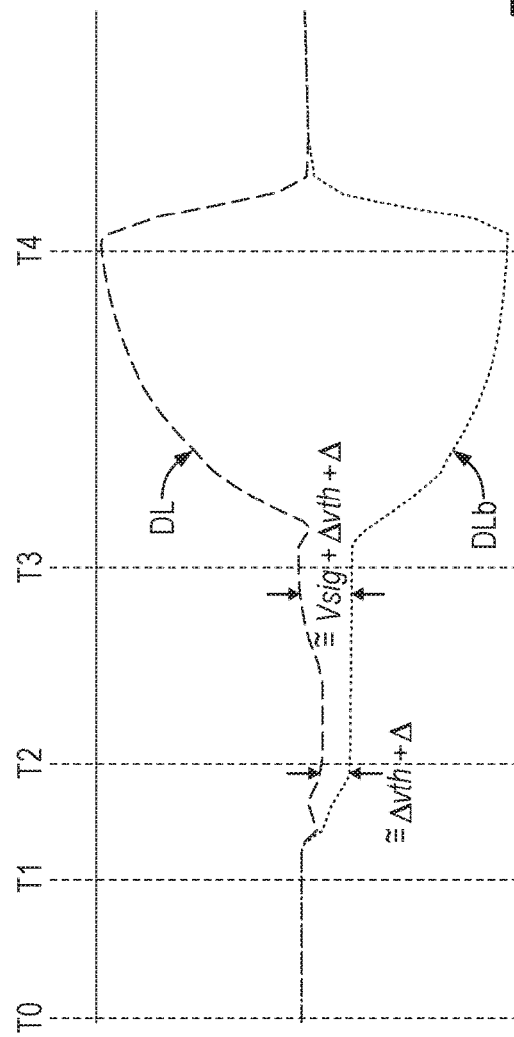

FIGS. 4A and 4B are diagrams of various signals during operation of the sense amplifier 300 according to an embodiment of the disclosure. FIG. 4A shows control signals BLEQ, BLECP, and ISO, voltages of power supply node ACT and access line WL. FIG. 4B shows voltages of digit lines DL and DLb.

Prior to time T1, the sense amplifier and digit lines have been precharged during a precharge phase. The transistor 319 is activated by an active control signal BLEQ to provide a voltage VBLP to node 315. The control signal BLEQ is an active level to activate the transistor 318 to form a conductive path between the nodes 314 and 315. Thus, with the BLEQ signal active, the nodes 314 and 315 have the same voltage level, namely, the voltage VBLP provided by the activated transistor 319. Also prior to time T1, the control signal ISO is at an inactive level (e.g., the ground voltage GND, a negative voltage, etc.) to deactivate the transistors 351 and 352. As a result, the nodes 314 and 315 are isolated from the transistors 312 and 313, respectively. In some embodiments of the disclosure, the control signal ISO may be inactive when at a negative voltage, such as −0.2V, to control any leakage current. The power supply node ACT is about a half of the voltage VARY (e.g., 0.5V) voltage prior to time T1. As a result, by time T1 the digit lines DL and DLb (which are coupled to nodes 314 and 315, respectively) are at the VBLP voltage. Additionally, the gate and drain of the transistor 310 are coupled together and the gate and drain of the transistor 311 are coupled together through the activated transistor 318, while the gate and drain of the transistors 312 and 313 are isolated from one another by the inactive transistors 316 and 317.

Next, the operation in a threshold voltage compensation (VtC) phase between times T1 and T2 is described. Following time T1, the transistors 319 and 318 are deactivated by an inactive BLEQ signal (e.g., at the ground level) to no longer provide the voltage VBLP to the nodes 315 and 314. The transistors 316 and 317 may be activated by an active signal BLECP. Upon activation, the transistor 316 may couple the drain of the transistor 312 to the gate of the transistor 312 and the node 315, and the transistor 317 may couple the drain of the transistor 313 to the gate of the transistor 313 and the node 314. The voltage provided to the power supply node ACT changes from about the half of the voltage VARY to the high voltage level, for example, VARY. The voltage of nodes 314 and 315 changes due to the VARY voltage provided to the power supply node ACT and the transistors 318 and 319 no longer providing the voltage VBLP to the nodes 314 and 315. As explained earlier, the transistors 312 and 313 should be matched and have a same threshold voltage vth, except that the transistor 313 actually has a threshold voltage of (vth+$\varDelta$vth) that deviates from the threshold voltage vth of the transistor 312 by $\varDelta$vth. Furthermore, the transistor 311 may also have a threshold voltage partially deviates from its threshold voltage of the transistor 311 by $\varDelta$. Thus, the compensation level difference between the nodes 314 and 315 may be represented as ($\Delta$vth+$\Delta$) that is a total of the threshold voltage deviations. The resulting voltages at nodes 314 and 315 causes the voltages of the digit lines DL and DLb, respectively, to change. In the present example operation, the voltage of digit line DL is greater than the voltage of digit line DLb (e.g., the voltage of node 314 is greater than the voltage of node 315) by the voltage difference of nodes 314 and 315, for example, ($\varDelta$vth+$\Delta$).

A difference between the respective voltages of nodes 314 and 315 (e.g., $\Delta$vth+$\Delta$) may represent a sum of a threshold voltage offset ($\Delta$vth) between the threshold voltages of the transistors 312 and 313 and a partial threshold voltage offset ($\Delta$) between the threshold voltages of the transistors 310 and 311. By developing the respective voltages at nodes 314 and 315, threshold voltage compensation (e.g., for the transistors 310 and 311 and 312 and 313) may be provided.

Next operation between times T2 and T3 is the third phase, the cell information sampling operation. An access line WL may be activated (e.g., changed to a high voltage level) following time T2 to couple a memory cell to the digit line DL or to the digit line DLb, for example, as previously described with reference to FIG. 2. The memory cell coupled to the digit line DL or DLb causes a voltage change on the respective digit line based on the data state stored by the memory cell. For example, the memory cell may cause the voltage of the respective digit line to increase when the stored data state corresponds to the memory cell storing a positive charge. The change in the respective digit line DL or DLb from the memory cell is reflected on the corresponding node 314 or 315. The node 314 is coupled to gates of the respective transistors 311 and 313 and the node 315 is coupled to gates of respective transistors, 310 and 312.

A difference between the respective voltages of nodes 314 and 315 (e.g., Vsig+Δvth+Δ) may represent a sum of the signal difference (Vsig) on digit lines Dl and DLb and the threshold voltage offset (Δvth) between the threshold voltages of the transistors 312 and 313 and the partial threshold voltage offset (Δ) between the threshold voltages of the transistors 310 and 311. Thus, the threshold voltage compensation (e.g., for the transistors 310 and 311 and 312 and 313) may be provided in addition to the signal difference.

Next operation between times T3 and T4 is the fourth phase, the sense amplifier activation phase. Following time T3, the control signal ISO changes to an active level to activate the transistors 351 and 352 to couple a conductive path between the nodes 314 and 315 and the transistors 312 and 313, respectively. After time T3, the voltage provided to the power supply node ACT also changes from about the half of the voltage VARY to the high voltage level VARY again to "activate" the sense amplifier 300. The respective voltages at the power supply nodes ACT and GND cause the voltage difference between the digit lines DL and DLb to be amplified by driving the sense nodes and digit lines to opposite voltage levels (e.g., high and low activation voltages) based on the voltage difference.

In the present example, with the memory cell increasing the voltage of the digit line DL, the transistor 313 is activated to a greater degree than the transistor 312. As a result, the digit line DLb begins to be pulled down to the low activation voltage provided to the power supply node (e.g., GND), which in turn begins to activate the transistor 310 to pull-up the sense node 314 and further activate the transistor 313. With the positive feedback loop of the transistor 313 and transistor 310, the digit line DLb (and sense node 315) is driven to the low activation voltage and the digit line DL (and the sense node 314) is driven to the high activation voltage. Prior the time T4, the access line WL becomes inactive (e.g., changes to an inactive (low) voltage level) to isolate the memory cell from the digit line DL.

During the sense amplifier activation phase the sense amplifier is activated by providing high and low activation voltages to the sense amplifier, and a voltage difference between the digit lines DL and DLb (e.g., resulting from the coupling of a memory cell to one of the digit lines) is amplified by driving the digit lines DL and DLb to opposite activation voltages based on the voltage difference.

After completing the sense amplifier activation phase, the operation comes back to the precharge phase from 14. Following time 14, the sense amplifier may be prepared for another sensing operation by precharging the digit lines DL and DLb, as previously described. For example, the control signal BLEQ becomes active again and activates the transistors 318 and 319. Additionally, following time T4, the control signal ISO also changes to the inactive level again to deactivate the transistors 351 and 352 to isolate the nodes 314 and 315 from the transistors 312 and 313, respectively. The voltage provided to the power supply node ACT changes from the high voltage level to about a half of the voltage VARY (e.g., 0.5V) voltage. As a result, the digit lines DL and DLb are coupled through the active transistor 318 and set to the precharge voltage, about the half of the voltage VARY through the active transistor 319. The sense amplifier 300 is placed into the same precharged state as previously described at time T0, and is ready for another access operation.

In the example of FIG. 4A, the power supply voltage ACT, and the control signals BLEQ, BLEEP are shown with a particular timing relative to the other voltages and control signals. However, embodiments of the disclosure include other voltage and signal timings different from those described with reference to FIG. 4A, Thus, the scope of the disclosure is not limited to the particular example of FIG. 4A. Because the sense amplifier 300 is directly coupled to the node GND, the minimum number of clock cycles required between opening a row of memory and accessing columns within it (e.g., RAS to CAS Delay, tRCD) may be relaxed.

In the example of FIG. 4A, the control signals BLEQ, ISO, BLECP may be activated at the voltage VARY or slightly over the voltage VARY. The control signal ISO may take the same voltage VARY with other control signals, without taking a voltage substantially greater than the voltage VARY, which may improve reliability. The power supply voltage provided to the power supply node ACT as described with reference to FIG. 4A may be provided by a voltage circuit. The voltage circuit may be controlled by internal signals, for example, from a command decoder (e.g., command decoder 125 of FIG. 1, in some embodiments of the disclosure).

Figure 5:
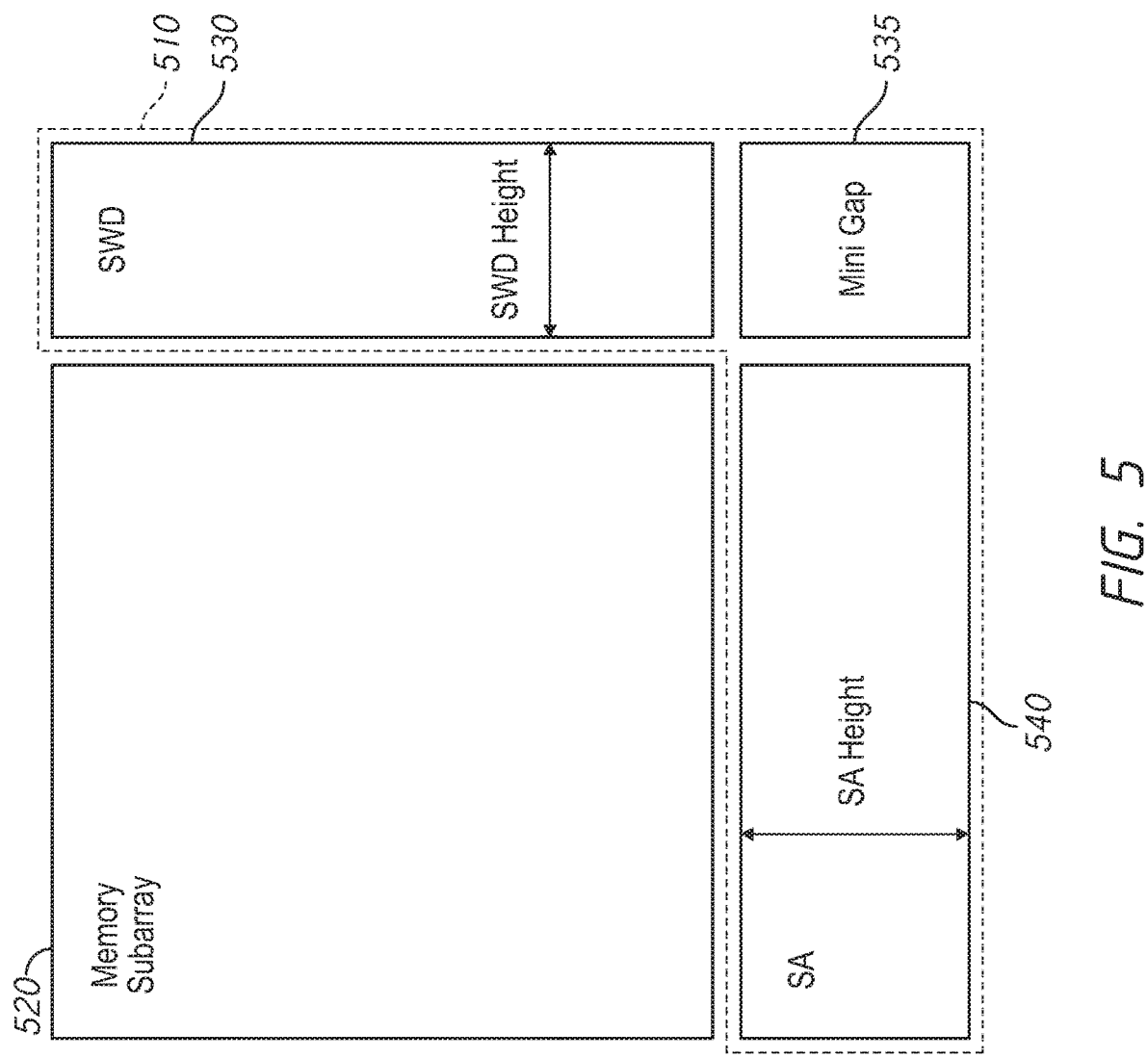
FIG. 5 is a diagram showing a layout for a portion of a peripheral region and a memory subarray region of a memory according to an embodiment of the disclosure.

FIG. 5 is a diagram showing a layout for a portion of a peripheral region 510 and a memory subarray region 520 of a memory according to an embodiment of the disclosure. In some embodiments of the disclosure, the memory subarray region 520 may be included in a memory cell array (e.g., included in memory cell array 145 of FIG. 1) and the peripheral region 510 may be disposed adjacent to and/or between memory subarray regions.

The peripheral region 510 includes a sub-word line driver (SWD) region 530. The SWD region 530 may include sub-word line driver circuits that selectively drive sub-word lines of the memory subarray region 520 to activate selected memory cells for access. The peripheral region 510 may further include a sense amplifier (SA) region 540 in which sense amplifiers may be included (e.g., sense amplifier 300 in some embodiments of the disclosure).

A mini-gap region 535 included in the peripheral region 510 may have dimensions based on a SWD Height of the SWD region 530 and a SA Height of the SA region 540. The mini-gap region 535 may include circuits used when operating sub-word drivers of the SWD region 530 and/or operating sense amplifiers of the SA region 540, including the sense amplifier 300. For example, the mini-gap region 535 may include voltage circuits that provide various voltages for operation of the sense amplifiers of the SA region 540.

In examples where the dimensions of the mini-gap region 535 and SA region 540 are relatively compact, it may become challenging to include some circuits, for example, voltage circuits that might have provided RNL drivers traditionally. Voltage circuits might have had relatively large dimensions due to the need for sufficient drivability of various voltages, otherwise. The sense amplifier 300 without a row N-sense-amp latch (RNL) driver in the mini-gap region 535 and SA region 540 may function with a compact peripheral area 510.

Figure 6:
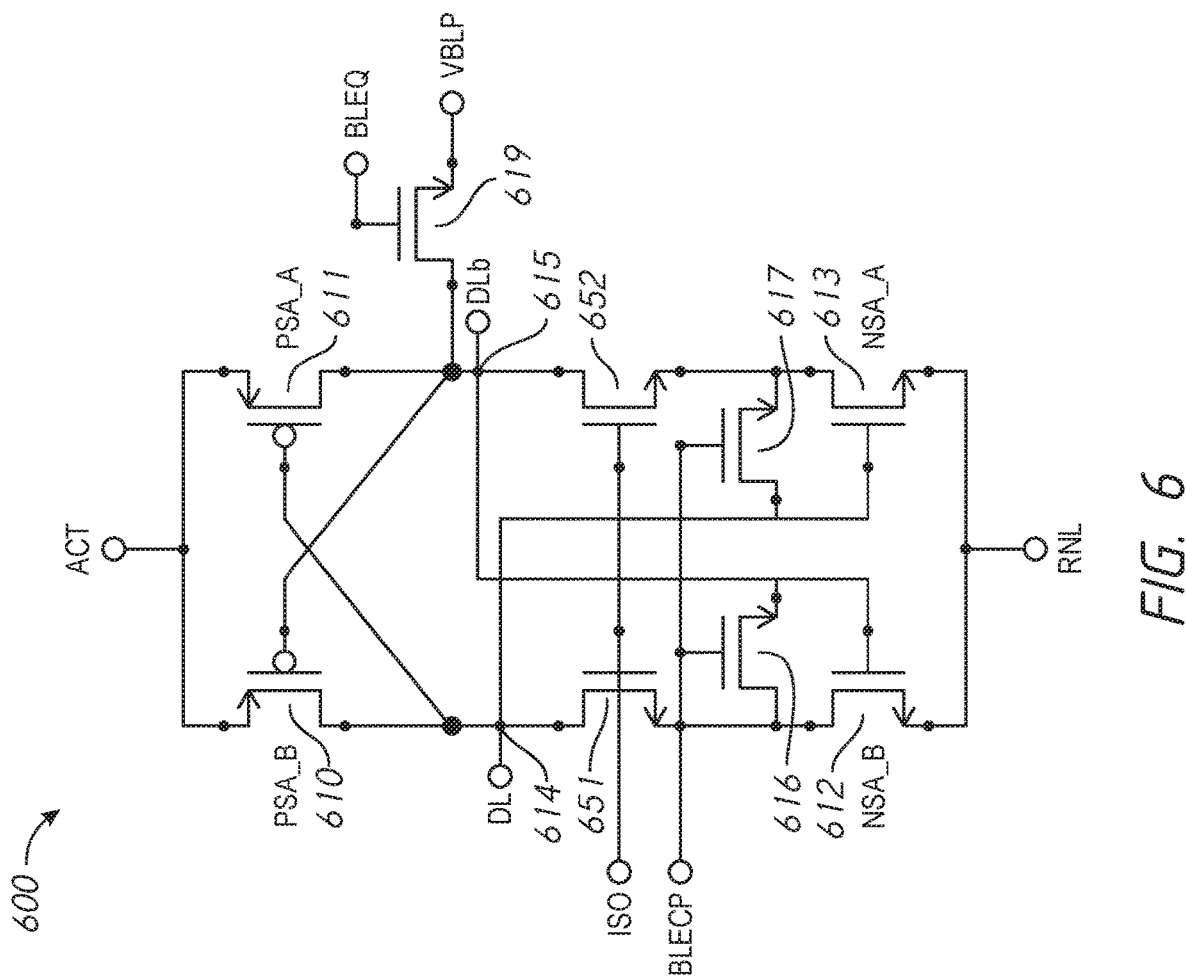
FIG. 6 is a schematic diagram of a sense amplifier according to an embodiment of the disclosure.

FIG. 6 is a schematic diagram of a sense amplifier 600 in accordance with an embodiment of the disclosure. The sense amplifier 600 may be included in one or more of the sense amplifiers 150 of FIG. 1 and/or the sense amplifier 210 of FIG. 2.

The sense amplifier 600 includes first type of transistors (e.g. p-type field effect transistors (PFET)) 610 and 611 having drains coupled to nodes 614 and 615, respectively. The sense amplifier 600 further includes second type of transistors (e.g., n-type field effect transistors (NFET)) 612 and 613 having drains coupled to the nodes 614 and 615 through isolation transistors 651 and 652, all respectively. Sources of the transistors 651 and 652 are coupled to the nodes 614 and 615 and drains of the transistors 651 and 652 are coupled to the nodes 616 and 617, all respectively. Respective gates of the transistors 610 and 612 are coupled to the node 615 and respective gates of the transistors 611 and 613 are coupled to the node 614. Sources of the transistors 610 and 611 are coupled to a power supply node ACT and sources of the transistors 612 and 613 are coupled to a power supply node RNL that receives a voltage from a row-N-sense-amp latch (RNL) driver. A digit line DL: is coupled to the node 614 and a digit line DLb is coupled to the node 615. The digit line DL may represent digit line DL 220 of FIG. 2 and the digit line DLb may represent digit line DLb 221 in some embodiments of the disclosure.

The sense amplifier 600 further includes a precharge transistor 619 coupled to node 315. The transistor 619 provides a voltage from its source to node 615 when activated by an active control signal BLEQ (e.g., high logic level). In some embodiments of the disclosure, the voltage VBLP is provided to the node 615 when the transistor 619 is active. In some embodiments of the disclosure, the voltage VBLP may be about 0.5V.

The sense amplifier 600 further includes transistors 616 and 617. The transistor 616 is coupled to the drain of the transistor 612 and the node 615 and the transistor 617 is coupled to the drain of the transistor 613 and the node 614. The transistors 616 and 617 are activated by an active control signal BLECP (e.g., active high logic level).

The transistors 610 and 611 are shown as PFETs and the transistors 612, 613, 616, 617, 651, 652 and 619 are shown as NFETs in FIG. 6. However, one or more of the transistors may be changed to a different type, to a different transistor, to a different circuit without departing from the scope of the disclosure.

As will be described below, the sense amplifier 600 may provide threshold voltage compensation. The sense amplifier 600 may provide advantageous over conventional sense amplifiers providing threshold voltage compensation. For example, the sense amplifier 600 may include fewer circuit components (e.g., transistors), such as including a relatively small row N-sense-amp latch (RNL) driver with a weaker driving ability, in comparison to such other sense amplifier designs. As a result, the sense amplifier 600, as well as other sense amplifiers according to embodiments of the disclosure, may provide a more compact circuit design.

An example operation of the sense amplifier 600 according to an embodiment of the disclosure will be described with reference to FIGS. 7A and 7B. In the example operation, it is assumed that the transistors 612 and 613 should be matched and have a same threshold voltage vth. However, typically due to variations in fabricating the transistors 612 and 613, the respective threshold voltages vth of the transistors 612 and 613 are not matched and are different. For example, assuming the transistors 612 and 613 are designed to have a nominal threshold voltage of vth, the threshold voltage mismatch between the transistors 612 and 613 may be characterized as $\Delta$vth. That is, the threshold voltage of transistor 613 deviates from the threshold voltage of the transistor 612 by $\Delta$vth. Similarly, due to variations in fabricating the transistors 610 and 611, the respective threshold voltages of the transistors 610 and 611 are not matched and are different. A partial threshold voltage mismatch between the transistors 610 and 611 may be characterized as $\Delta$. Threshold voltage compensation may be provided by compensation voltage(s) provided to one or both of nodes 614 and 615 in preparation of activating the sense amplifier 600. The compensation voltage(s) provided to the nodes 614 and 615 may compensate for the threshold voltage mismatch among the transistors 612, 613, 610 and 711, which may be represented as ($\Delta$vth+$\Delta$) that is a total of the threshold voltage deviation.

Figure 7A:
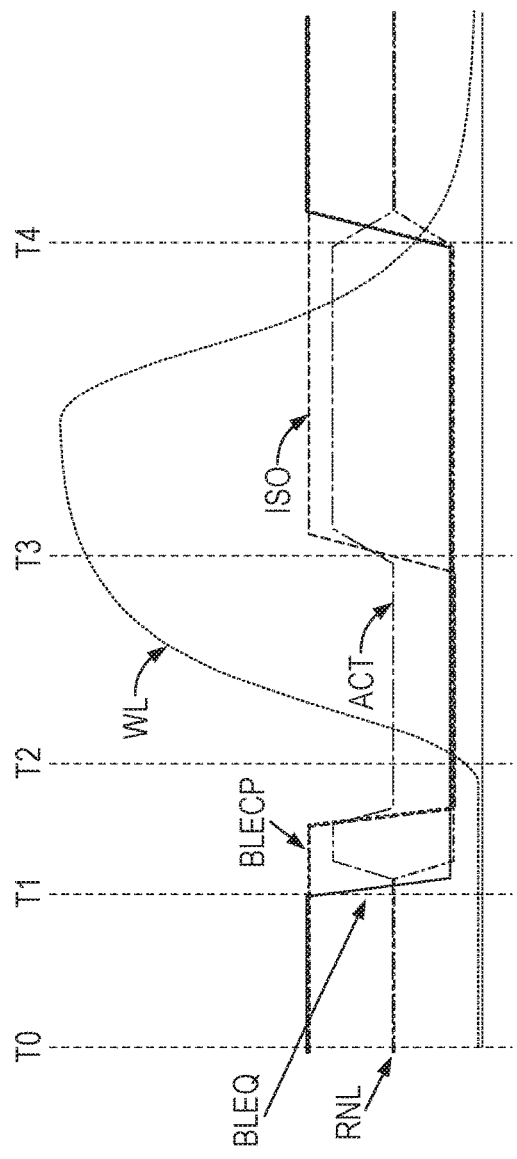
FIGS. 7A and 7B are timing diagrams of various signals during operation of the sense amplifier according to an embodiment of the disclosure.
Figure 7B:
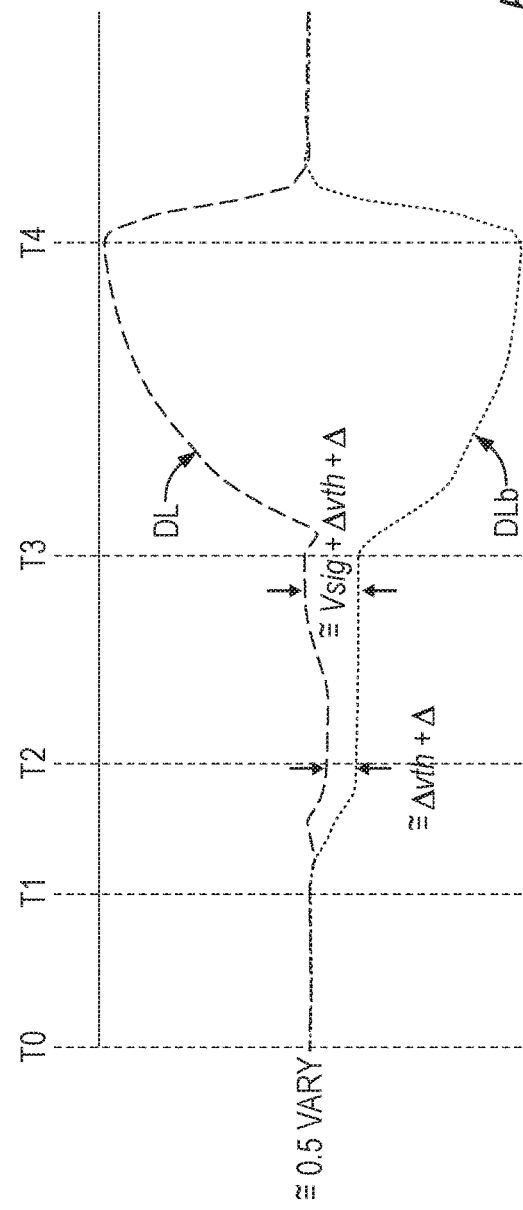

FIGS. 7A and 7B are diagrams of various signals during operation of the sense amplifier 600 according to an embodiment of the disclosure. FIG. 7A shows control signals BLEQ, BLECP, and ISO, voltages of power supply node ACT and access line WL FIG. 7B shows voltages of digit lines DL and DLb.

Prior to time T1, the sense amplifier and digit lines have been precharged during a precharge phase. The transistor 619 is activated by an active control signal BLEQ to provide a voltage VBLP to node 615. Also, the control signal ISO is at an active level to activate the transistors 651 and 652 to keep coupling a conductive path between the transistors 610 and 611 through the nodes 614 and 615 and the transistors 612 and 613, respectively. Additionally, the transistors 616 and 617 may be activated by an active signal BLECP. Upon activation, the transistor 616 may couple the gate and drain of the transistor 612 to the node 615 and the transistor 617 may couple the gate and drain of the transistor 613 to the node 614. As a result, by the activated transistors 616, 617, 651 and 652, the digit lines DL and DLb (which are coupled to nodes 614 and 615, respectively) change from complementary voltage levels to the VBLP voltage by time T1.

A voltage provided to the power supply node ACT changes from the high voltage level to about a half of the voltage VARY (e.g., 0.5V) voltage, and a voltage provided to the power supply node RNL changes from the low voltage level to about the half of the voltage VARY.

Next, the operation in a threshold voltage compensation (VtC) phase between times T1 and T2 is described. Following time T1, the transistor 619 is deactivated by an inactive BLEQ signal (e.g., at the ground level) to no longer provide the voltage VBLP to the nodes 615 and 614, The voltage provided to the power supply node ACT changes from about the half of the voltage VARY to the high voltage level, for example, VARY, while the voltage provided to the power supply node RNL changes from about the half of the voltage VARY to the low voltage level, for example, the ground level (GND). The voltages of nodes 614 and 615 change due to the VARY voltage provided to the power supply node ACT and the transistor 619 no longer providing the voltage VBLP to the node 615, still the nodes 614 and 615 coupled together through the transistors 616, 617, 651 and 652, responsive to the active control signals, BLECP and ISO. Responsive to the inactive BLEQ signal, the high voltage at the power supply node ACT and the ground voltage at the power supply node RNL, the signal levels of DL and DLb start changing.

As explained earlier, the transistors 612 and 613 should be matched and have a same threshold voltage vth, except that the transistor 613 actually has a threshold voltage of (vth+ $\Delta$vth) that deviates from the threshold voltage vth of the transistor 612 by Δvth. Furthermore, the transistor 611 may also have a threshold voltage partially deviates from its threshold voltage of the transistor 610 by Δ. Thus, the compensation level difference between the nodes 614 and 615 may be represented as (Δvth+Δ) that is a total of the threshold voltage deviations. The resulting voltages at nodes 614 and 615 cause the voltages of the digit lines DL and DLb, respectively, to change. In the present example operation, the voltage of digit line DL is greater than the voltage of digit line DLb (e.g., the voltage of node 614 is greater than the voltage of node 615) by the voltage difference of nodes 614 and 615, for example, (Δvth+Δ).

A difference between the respective voltages of nodes 614 and 615 (e.g., Δvth+Δ) may represent a sum of a threshold voltage offset (Δvth) between the threshold voltages of the transistors 612 and 613 and a partial threshold voltage offset (Δ) between the threshold voltages of the transistors 610 and 611. By developing the respective voltages at nodes 614 and 615, threshold voltage compensation (e.g., for the transistors 610 and 611 and 612 and 613) may be provided.

After a while, the control signal BLECP is deactivated, and the nodes 614 and 615 are isolated from the transistors 652 and 613, 651 and 612, respectively. The voltage provided to the power supply node ACT changes to about the half of the voltage VARY again. In this manner, the threshold voltage compensation phase is performed.

Next operation between times T2 and T3 is the third phase, the cell information sampling operation. An access line WL may be activated (e.g., changed to a high voltage level) following time T2 to couple a memory cell to the digit line DL or to the digit line DLb, for example, as previously described with reference to FIG. 2. The memory cell coupled to the digit line DL or DLb causes a voltage change on the respective digit line based on the data state stored by the memory cell. For example, the memory cell may cause the voltage of the respective digit line to increase when the stored data state corresponds to the memory cell storing a positive charge. The change in the respective digit line DL or DLb from the memory cell is reflected on the corresponding node 614 or 615. The node 614 is coupled to gates of the respective transistors 611 and 613 and the node 615 is coupled to gates of respective transistors, 610 and 612.

A difference between the respective voltages of nodes 614 and 615 (e.g., Vsig Δvth+Δ) may represent a sum of the signal difference (Vsig) on digit lines Dl and DLb and the threshold voltage offset (Δvth) between the threshold voltages of the transistors 612 and 613 and the partial threshold voltage offset (Δ) between the threshold voltages of the transistors 610 and 611. Thus, the threshold voltage compensation (e.g., for the transistors 610 and 611 and 612 and 613) may be provided in addition to the signal difference.

Next operation between times T3 and T4 is the fourth phase, the sense amplifier activation phase. Following time T3, the control signal ISO changes to an active level to activate the transistors 651 and 652 to couple a conductive path between the nodes 614 and 615 and the transistors 612 and 613, respectively. After time T3, the voltage provided to the power supply node ACT also changes from about the half of the voltage VARY to the high voltage level VARY again to "activate" the sense amplifier 600. The voltage provided to the power supply node RNL, stays at the ground voltage level. The respective voltages at the power supply nodes ACT and RNL cause the voltage difference between the digit lines DL and DLb to be amplified by driving the sense nodes and digit lines to opposite voltage levels (e.g., high and low activation voltages) based on the voltage difference.

In the present example, with the memory cell increasing the voltage of the digit line the transistor 613 is activated to a greater degree than the transistor 612. As a result, the digit line DLb begins to be pulled down to the low activation voltage provided to the power supply node (e.g., GND), which in turn begins to activate the transistor 610 to pull-up the sense node 614 and further activate the transistor 613. With the positive feedback loop of the transistor 613 and transistor 610, the digit line DLb (and sense node 615) is driven to the low activation voltage and the digit line DL (and the sense node 61A) is driven to the high activation voltage. Prior the time 14, the access line WL becomes inactive (e.g., changes to an inactive (low) voltage level) to isolate the memory cell from the digit line DL.

During the sense amplifier activation phase the sense amplifier is activated by providing high and low activation voltages to the sense amplifier, and a voltage difference between the digit lines DL and DLb (e.g., resulting from the coupling of a memory cell to one of the digit lines) is amplified by driving the digit lines DL and DLb to opposite activation voltages based on the voltage difference.

After completing the sense amplifier activation phase, the operation comes back to the precharge phase from T4. Following time T4, the sense amplifier may be prepared for another sensing operation by precharging the digit lines DL and DLb, as previously, described. For example, the control signals BLEQ becomes active again that activates the transistor 619. The control signal BLECP becomes active again while the control signal ISO stays active, which activate the transistors 616, 617, 651 and 652 together to couple a conductive path between the nodes 614 and 615. The voltages provided to the power supply nodes ACT and RNL change to about a half of the voltage VARY (e.g., 0.5V) voltage. As a result, the digit lines DL and DLb are equalized through the active transistors 616, 617, 651 and 652 and set to the precharge voltage VBLP through the active transistor 619. The sense amplifier 600 is placed into the same precharged state as previously described at time T0, and is ready for another access operation.

In the example of FIG. 7A, the power supply voltage ACT, and the control signals BLEQ, ISO, BLECP are shown with a particular timing relative to the other voltages and control signals. However, embodiments of the disclosure include other voltage and signal timings different from those described with reference to FIG. 6. Thus, the scope of the disclosure is not limited to the particular example of FIG. 6. Because the power supply node RNL stays at the ground voltage level from the voltage compensation phase, the amplification is caused without waiting for the voltage change at the power supply node RNL as known. The size of an RNL driver does not affect speed of activation of the sense amplifier 600. Thus, the minimum number of clock cycles required between opening a row of memory and accessing columns within it (e.g., RAS to CAS Delay, tRCD) may be relaxed.

The power supply voltage provided to the power supply node ACT as described with reference to FIG. 6 may be provided by a voltage circuit. The voltage circuit may be controlled by internal signals, for example, from a command decoder (e.g., command decoder 125 of FIG. 1, in some embodiments of the disclosure).

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a first transistor including a first source coupled to a first power supply node, a first drain coupled to a first node, and a first gate coupled to a second node;
a second transistor including a second source coupled to the first power supply node, a second drain coupled to the second node, and a second gate coupled to the first node;
a third transistor including a third source coupled to a second power supply node, a third gate coupled to the second node; and a third drain;
a fourth transistor including a fourth source coupled to the second power supply node, a fourth gate coupled to the first node, and a fourth drain;
a fifth transistor including a fifth source coupled to the third drain, a fifth drain coupled to the first node, and a fifth gate configured to receive a first control signal;
a sixth transistor including a sixth source coupled to the fourth drain, a sixth drain coupled to the second node, and a sixth gate configured to receive the first control signal;
a seventh transistor including a seventh source coupled to the second node, a seventh drain coupled to the third drain, and a seventh gate configured to receive a second control signal;
an eighth transistor including an eighth source coupled to the first node, an eighth drain coupled to the fourth drain, and an eighth gate configured to receive the second control signal; and
a ninth transistor including a ninth source configured to receive a voltage, a ninth drain coupled to at least one of the first or second nodes, and a ninth gate configured to receive a third control signal.

2. The apparatus of claim 1, wherein threshold voltages for the third and fourth transistors are different by a first offset, and
wherein the first node and the second node are configured to have a voltage level difference before cell information sampling to compensate for the first offset.

3. The apparatus of claim 1, wherein the second power supply node is a ground node at a ground voltage level.

4. The apparatus of claim 1, further comprising a tenth transistor including a tenth source coupled to the second node, a tenth drain coupled to the first node, and a tenth gate configured to receive the third control signal.

5. The apparatus of claim 1, wherein the second power supply node is coupled driver.

6. The apparatus of claim 1, wherein the first node is further coupled to a first digit line and the second node is further coupled to a second digit line.

7. The apparatus of claim 1, wherein a high voltage level of the first power supply node is lower than a high voltage level of the first, second and third control signals.

8. The apparatus of claim 1, wherein a high voltage level of the first control signal is the same as a high voltage level of the second and third control signals.

9. The apparatus of claim 1, wherein a low voltage level of the first control signal is lower than a ground voltage level.

10. The apparatus of claim 1 wherein the first and second transistors comprise p-type field effect transistors and wherein the third and fourth transistors comprise n-type field effect transistors.

11. The apparatus of claim 10, wherein the fifth, sixth, seventh, eighth and ninth transistors comprise n-type field effect transistors.

12. An apparatus, comprising:
first, second, and third transistors series coupled between a first power supply node and a second power supply node;
fourth, fifth, and sixth transistors series coupled between the first power supply node and the second power supply node;
a seventh transistor coupled to the second and third transistors, and to a second node between the fourth and fifth transistors; and
an eighth transistor coupled to the third and fourth transistors, and to a first node between the first and second transistors; and
a ninth transistor coupled to at least one of the first and second nodes,
wherein gates of the first and third transistors are coupled to the second node and gates of the fourth and sixth transistors are coupled to the first node.

13. The apparatus of claim 12, wherein the ninth transistor is configured to be activated during a precharge phase,
wherein the seventh and eighth transistors are configured to be activated during a threshold voltage compensation phase and the second, fifth, and ninth transistors are deactivated during the threshold voltage compensation phase,
wherein the second, fifth, seventh and eighth transistors are configured to be activated during an activation phase.

14. The apparatus of claim 13, wherein the seventh and eighth transistors are configured to be deactivated during a cell sampling phase between the threshold voltage compensation phase and the activation phase.

15. The apparatus of claim 12, further comprising a tenth transistor,
wherein the ninth and tenth transistors are configured to be activated during the precharge phase and the seventh and eighth transistors are configured to be deactivated during the precharge phase.

16. The apparatus of claim 12, wherein the second power supply node comprises a ground node at a ground voltage level.

17. A method, comprising:
precharging first and second sense nodes of a sense amplifier to a precharge voltage, wherein first and second transistors are coupled to the first and second sense nodes, respectively;
deactivating a first isolation transistor coupled to the first sense node and to a third transistor, and deactivating a second isolation transistor coupled to the second sense node and to a fourth transistor, in order to isolate the first and second sense nodes from the third and fourth transistors coupled to a ground node at a ground voltage level, respectively; and
coupling a drain and a gate of the third and fourth transistors to the second and first sense nodes, respectively.

18. The method of claim 17, providing a voltage difference between the respective voltages of the second and first sense nodes to compensate for a difference between the respective threshold voltages of the fourth and third transistors.

19. The method of claim 17, further comprising activating a transistor coupled to the first and second sense nodes to equalize the first and second sense nodes.

20. The method of claim 17, wherein deactivating the first isolation transistor and the second isolation transistor is responsive to a first control signal,
 wherein coupling the drain and gate of the third and fourth transistors to the second and first sense nodes, respectively is responsive to a second control signal, and
 wherein a high voltage level of the first control signal is the same as a high voltage level of the second control signal.

21. The method of claim 20, wherein a low voltage level of the first control signal is lower than the ground voltage level.

\* \* \* \* \*

UNITED STATES PATENT AND TRADEMARK OFFICE
CERTIFICATE OF CORRECTION

PATENT NO. : 11,152,055 B1
APPLICATION NO. : 16/934909
DATED : October 19, 2021
INVENTOR(S) : Kyuseok Lee Page 1 of 1

It is certified that error appears in the above-identified patent and that said Letters Patent is hereby corrected as shown below:

In the Claims

| | Reads | Should Read |
|---|---|---|
| Column 15 Line 51 | "wherein the second power supply node is coupled driver." | --wherein the second power supply node is coupled to a driver.-- |

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*